(12) United States Patent
 Salter et al.

(10) Patent No.: US 11,117,626 B2
(45) Date of Patent: Sep. 14, 2021

(54) VEHICLE SKID PLATE SENSOR SYSTEM AND METHODS OF USE

(71) Applicant: Ford Global Technologies, LLC, Dearborn, MI (US)

(72) Inventors: Stuart C. Salter, White Lake, MI (US); Pietro Buttolo, Dearborn Heights, MI (US); David Brian Glickman, Southfield, MI (US); Paul Kenneth Dellock, Northville, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 204 days.

(21) Appl. No.: 16/518,200

(22) Filed: Jul. 22, 2019

(65) Prior Publication Data

US 2021/0024141 A1   Jan. 28, 2021

(51) Int. Cl.
| | | |
|---|---|---|
| *B62D 25/20* | (2006.01) | |
| *B60R 19/48* | (2006.01) | |
| *B60R 19/54* | (2006.01) | |
| *B60K 31/00* | (2006.01) | |
| *H03K 17/955* | (2006.01) | |
| *B60R 19/02* | (2006.01) | |

(52) U.S. Cl.
CPC ........ *B62D 25/2072* (2013.01); *B60R 19/023* (2013.01); *B60R 19/48* (2013.01); *B60R 19/54* (2013.01); *H03K 17/955* (2013.01); *B60K 2031/0016* (2013.01)

(58) Field of Classification Search
CPC ......... B60R 13/04; B60R 19/44; B60R 19/52; B60R 19/54; B60R 2021/01013; B60R 2021/01304; B60R 2021/01308; B60R 21/013; B60R 21/0134; B60R 19/023; B62D 25/2072; B62D 21/155; B60K 2031/0016; B60K 31/0008; H03K 17/955; G08C 19/10
USPC .................. 296/187.08, 199; 280/304.3, 784
See application file for complete search history.

(56) References Cited

U.S. PATENT DOCUMENTS

| | | | | |
|---|---|---|---|---|
| 3,599,742 | A  * | 8/1971  | Lowery .................. | B60K 11/06 180/9 |
| 2008/0246289 | A1* | 10/2008 | Skinner ................... | B60R 19/52 293/115 |
| 2008/0297176 | A1  | 12/2008 | Douglas | |
| 2009/0045824 | A1  | 2/2009  | Douglas et al. | |
| 2010/0079283 | A1* | 4/2010  | Hammerschmidt ........................ | H03K 17/955 340/562 |
| 2010/0289506 | A1  | 11/2010 | Moon | |
| 2018/0072254 | A1* | 3/2018  | Wymore ................. | B60R 9/065 |
| 2019/0126868 | A1* | 5/2019  | Wymore ................. | B60R 19/44 |

(Continued)

FOREIGN PATENT DOCUMENTS

| | | | | |
|---|---|---|---|---|
| GB | 2423822 | | 9/2006 | |
| JP | 2017-106781 | * | 6/2017 | ............ B60R 21/00 |
| KR | 20180058969 | | 6/2018 | |

*Primary Examiner* — Gregory A Blankenship
(74) *Attorney, Agent, or Firm* — David Coppiellie, Esq.; Carlson, Gaskey & Olds, P.C.

(57) ABSTRACT

A vehicle assembly includes, among other things, a bumper assembly, a skid plate, and a capacitive sensor system of the skid plate. A sensing method for a vehicle includes using a capacitive sensing system to detect a proximity of a vehicle to an object. The capacitive sensing system is incorporated into a skid plate that is vertically beneath a portion of a bumper assembly of the vehicle.

18 Claims, 4 Drawing Sheets

(56) References Cited

U.S. PATENT DOCUMENTS

| | | | |
|---|---|---|---|
| 2020/0031753 A1* | 1/2020 | Han | C07C 211/17 |
| 2020/0070601 A1* | 3/2020 | Greggs | B60D 1/50 |
| 2020/0070602 A1* | 3/2020 | Greggs | B62D 25/2072 |
| 2020/0070895 A1* | 3/2020 | Greggs | B62D 21/02 |
| 2020/0130620 A1* | 4/2020 | Gutierrez | B62D 65/16 |
| 2020/0361543 A1* | 11/2020 | Grattan | B62D 25/2018 |
| 2021/0024023 A1* | 1/2021 | Shenaq | B60R 19/12 |
| 2021/0024141 A1* | 1/2021 | Salter | B60R 19/483 |

\* cited by examiner

VEHICLE SKID PLATE SENSOR SYSTEM AND METHODS OF USE

TECHNICAL FIELD

This disclosure relates generally to a sensor system for a vehicle and, more particularly, to skid plate having a sensor system.

BACKGROUND

A vehicle can include a skid plate vertically beneath a bumper assembly. The skid plate can extend beneath an underbody of the vehicle. The skid plate can protect the underbody of the vehicle.

SUMMARY

A vehicle assembly according to an exemplary aspect of the present disclosure includes, among other things, a bumper assembly, a skid plate, and a capacitive sensor system of the skid plate.

In another example embodiment of the foregoing assembly, the capacitive sensor system comprises a graphene infused material.

Another example embodiment of any of the foregoing assemblies includes a skin covering the graphene infused material.

In another example embodiment of any of the foregoing assemblies, the skin is molded-in-color and is non-conductive.

In another example embodiment of any of the foregoing assemblies, the capacitive sensor system is from 10 to 25 percent by weight graphene.

In another example embodiment of any of the foregoing assemblies, the capacitive sensor system includes a conductive coating adjacent a base substrate.

In another example embodiment of any of the foregoing assemblies, the capacitive sensor system is sealed within the skid plate.

In another example embodiment of any of the foregoing assemblies, an active ground extends about a periphery of the capacitive sensor.

In another example embodiment of any of the foregoing assemblies, the active ground is sealed within the skid plate.

In another example embodiment of any of the foregoing assemblies, the skid plate is electrically isolated from the bumper assembly.

In another example embodiment of any of the foregoing assemblies, the skid plate faces vertically downward.

A sensing method for a vehicle according to another exemplary aspect of the present disclosure includes using a capacitive sensing system to detect a proximity of a vehicle to an object. The capacitive sensing system is incorporated into a skid plate that is vertically beneath a portion of a bumper assembly of the vehicle.

In another example of the foregoing method, the capacitive sensor system comprises a graphene infused material.

In another example of any of the foregoing methods, the capacitive sensor system is sealed within the skid plate.

In another example of any of the foregoing methods, the skid plate is electrically isolated from the bumper assembly.

In another example of any of the foregoing methods, the skid plate faces vertically downward.

Another example of any of the foregoing methods includes evaluating a rate of change in an output signal from the capacitive sensing system to detect whether the object is moving relatively closer to the skid plate or whether contaminants are accumulating on the capacitive sensing system.

Another example of any of the foregoing methods includes recommending that the vehicle is washed based on an output signal from the capacitive sensing system.

Another example of any of the foregoing methods includes comparing an output signal from the capacitive sensing system to a threshold value to assess a distance between the vehicle and terrain beneath the vehicle.

Another example of any of the foregoing methods includes evaluating a rate of change in an output signal from the capacitive sensing system to assess a road condition.

The embodiments, examples and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE FIGURES

The various features and advantages of the disclosed examples will become apparent to those skilled in the art from the detailed description. The figures that accompany the detailed description can be briefly described as follows.

DETAILED DESCRIPTION

This disclosure details a sensor system for a vehicle and methods for using the sensor system. The sensor system is a capacitive sensor system and is incorporated into a skid plate.

Figure 1:
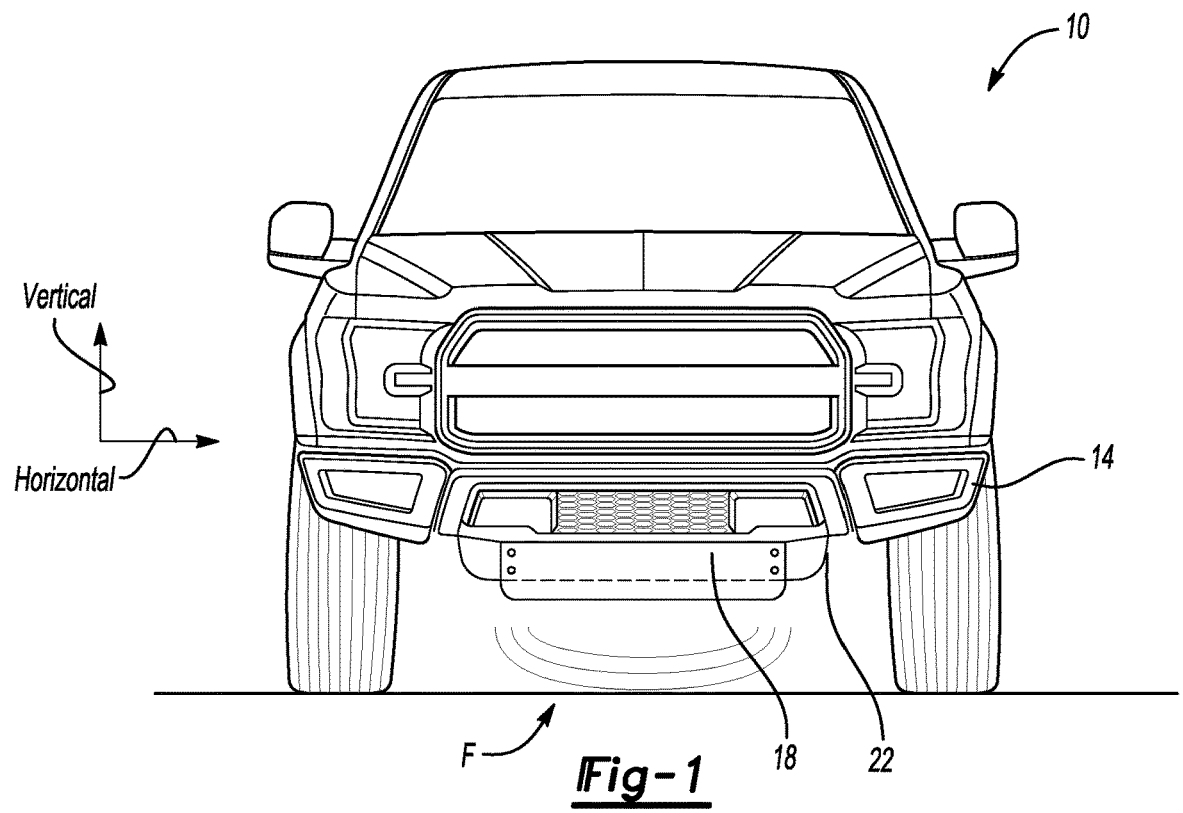
FIG. 1 illustrates a front view of a vehicle incorporating a skid plate according to an exemplary aspect of the present disclosure.
Figure 2:
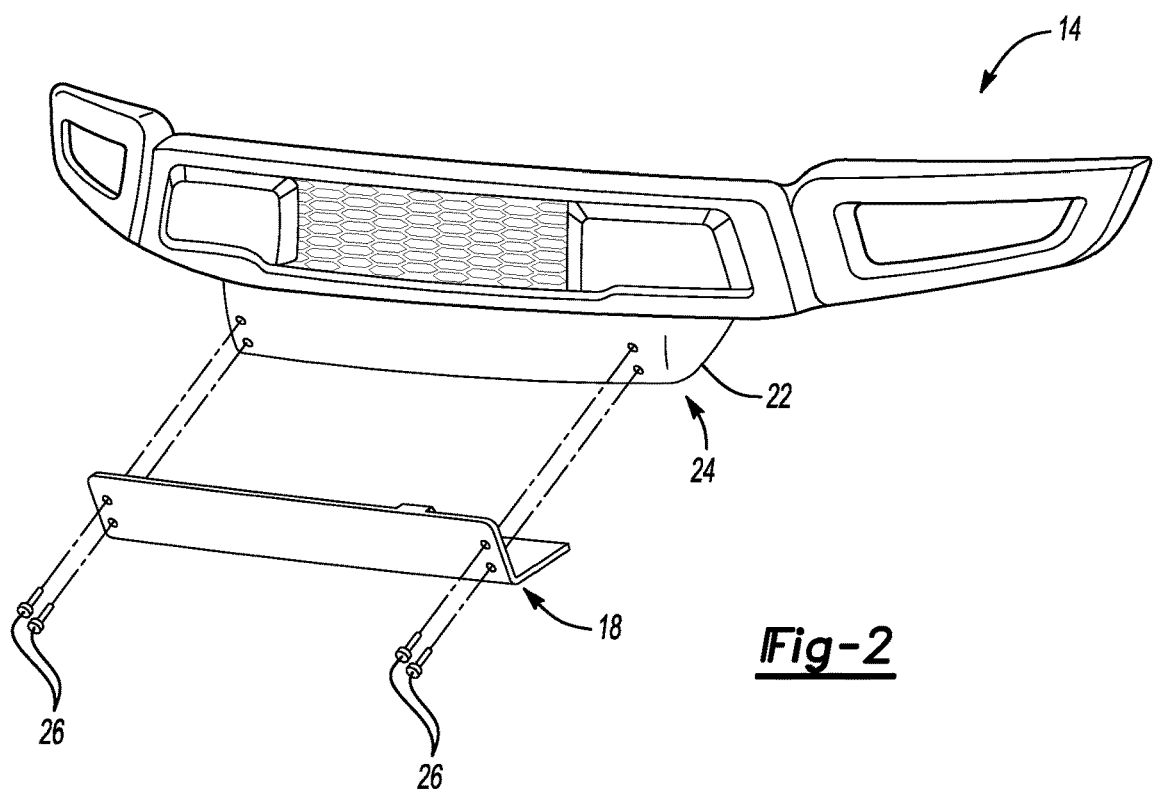
FIG. 2 illustrates a perspective view of the skid plate of FIG. 1 and a bumper assembly.
Figure 3:
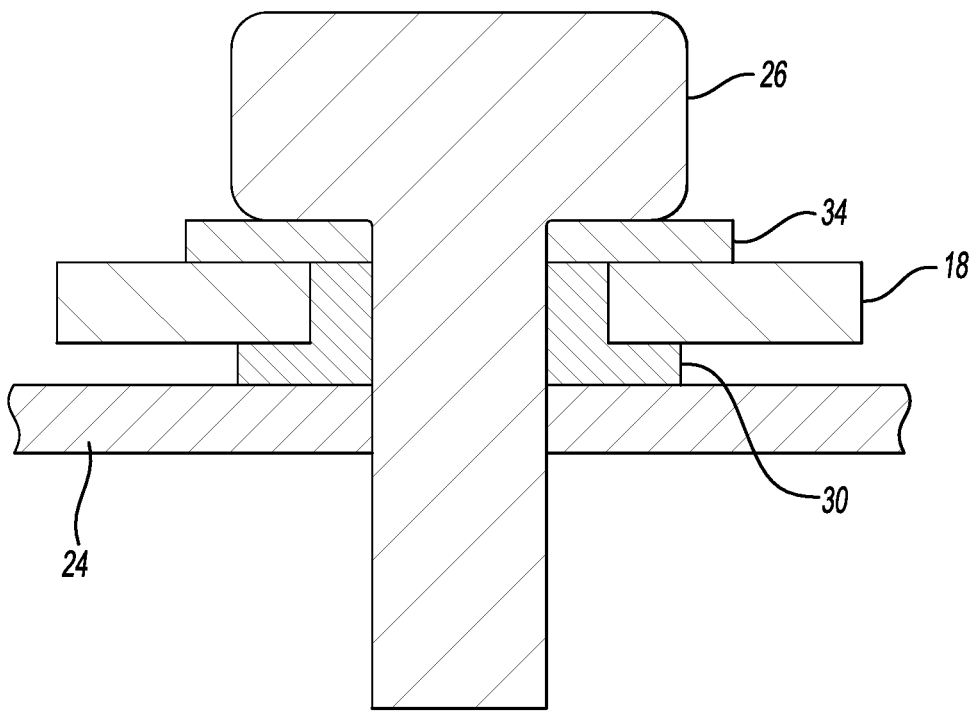
FIG. 3 illustrates a section view of a fastener attaching the skid plate to the vehicle of FIG. 1.

With reference to FIGS. 1-3, a vehicle 10 includes a bumper assembly 14 and a skid plate 18. The bumper assembly 14 is a front bumper assembly in this example. The skid plate 18 is vertically below at least a portion of the bumper assembly 14. For purposes of this disclosure, vertical is with reference to ground and a general orientation of the vehicle 10 during operation.

The skid plate 18 can protect areas of the vehicle 10, such as an underbody 22 of the vehicle 10. For example, if the vehicle 10 is driven over a rocky area, the skid plate 18 can block rocks from directly contacting and damaging the underbody 22 of the vehicle 10. At the front of the vehicle 10, a portion of the skid plate 18 extends vertically below the other structures of the vehicle 10 to provide a protective barrier.

The skid plate 18 can be attached to a body structure 24 of the vehicle 10 with a plurality of mechanical fasteners 26, here bolts. In another example, the skid plate 18 could be attached via arrow-head type fasteners or another type of fastener.

In the exemplary embodiment, the mechanical fasteners 26 extend through an isolating compression limiter 30, and an insulating spacer 34, which sandwich a portion of the skid plate 18. The compression limiter 30 and insulating spacer 34 electrically isolate the skid plate 18 from the body structure 24 and the bumper assembly 14.

Figure 4:
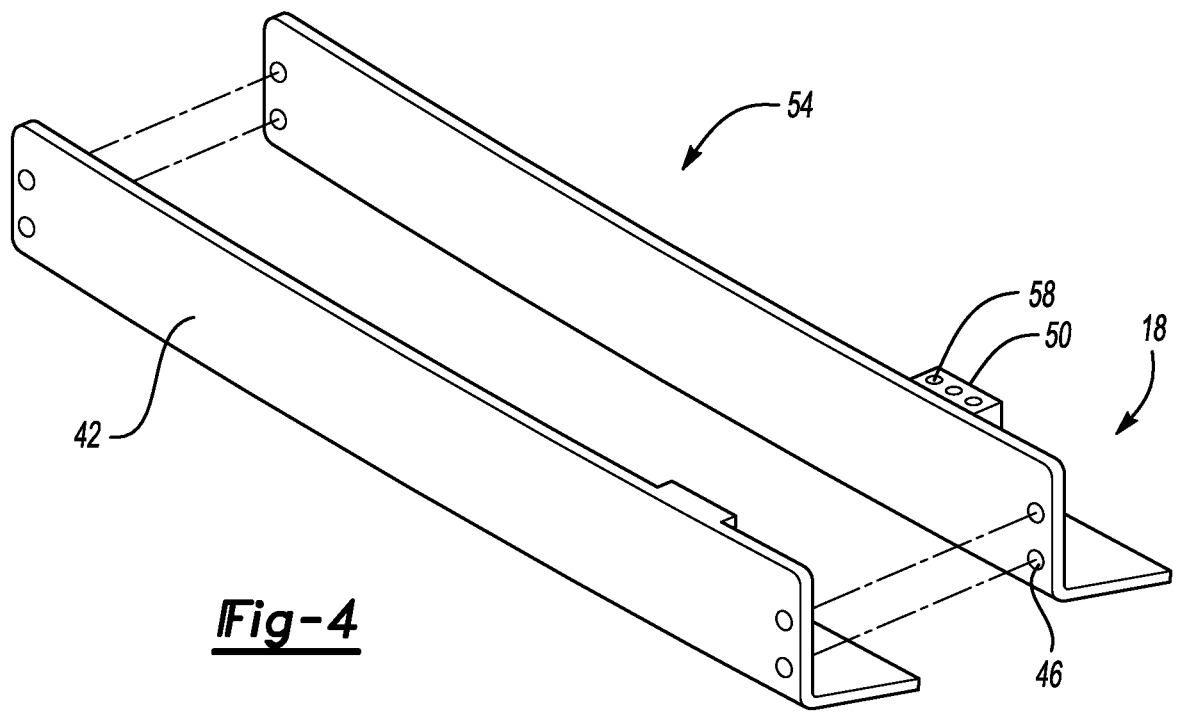
FIG. 4 illustrates a close-up expanded view of the skid plate.

With reference to FIG. 4, in the exemplary embodiment, the skid plate 18 includes a conductive coating 42 or primer applied to a base substrate 46. The base substrate 46 can be a polymer-based material.

In this example, the conductive coating 42 is exposed. In another example, the conductive coating 42 can be covered with a molded-in-color decorative skin to encapsulate the conductive coating 42 and seal the conductive coating 42 between the base substrate 46 and the decorative skin. The decorative skin could be, for example a non-conductive thermoplastic polyolefin.

The conductive coating 42 of the skid plate 18 provides a sensor of a capacitive sensor system. Capacitive sensor systems, as known, can be utilized to detect conductive objects or objects that have a dielectric different than air.

An active ground extends about a periphery of the conductive coating 42, i.e., about the capacitive sensor. The active ground and the conductive coating 42 can be covered by the decorative skin to seal the active ground and conductive coating 42 within the skid plate 18.

During operation, a voltage is applied to the conductive coating 42 causing an electrical field F (FIG. 1) to propagate from the conductive coating 42. Depending on the orientation of the skid plate 18 and the conductive coating 42, the field F can propagate vertically downward, horizontally forward from the vehicle 10, or both.

The skid plate 18 can then be used as a proximity sensor system that detects nearby objects based on changes to the electrical field. A person having skill in this art and the benefit of this disclosure would understand how to apply a voltage to a conductive coating 42 to cause the conductive coating 42 to emit an electrical field capable of sensing a target external to the vehicle 10.

A capacitive module 50 can be secured to a backside 54 of the skid plate 18 and connected to the conductive coating 42 by, for example, wrapping the conductive coating 42 around to printed circuit board contacts 58 of the capacitive module 50. The capacitive module 50 can include a controller module that alters the voltage applied to the conductive coating 42 and provides an output signal indicating the targets position relative to the vehicle 10.

In another example, the conductive coating 42 separate from the base substrate 46 is not required and the skid plate 18 incorporates a graphene-infused material to provide a sensor of the capacitive sensor system. In the graphene-infused embodiment, the graphene provides the conductivity necessary for the capacitive sensor system.

After the graphene-infused material has cured, the graphene-infused material can be over-molded with the relatively thin molded-in-color decorative skin, such as the skin described in connection with the embodiment of FIG. 4.

The graphene-infused skid plate can be from 10 to 25 percent by weight graphene. In a more specific embodiment, the graphene-infused skid plate is 20 percent by weight graphene. Electrical conductivity in graphene-infused material composition has been found to sharply increase once the percent by weight is above 10. As a percent by weight of graphene increases from 10 to 15, the electrical conductivity continues to increase.

A voltage can be applied to the graphene-infused skid plate to cause the electrical field to propagate from the graphene-infused skid plate. The graphene-infused material can be molded to directly contact the printed circuit board contacts of the capacitive module.

The capacitive sensor system of the skid plate 18 can be relied on to alert a user that the vehicle 10 is a certain distance from an obstacle. For example, the capacitive sensor system could alert the user to a curb when parking the vehicle 10, for example. The capacitive sensor system within the skid plate 18 can be used in addition to other existing sensors on the vehicle 10 utilized when parking the vehicle 10, such as ultrasonic sensors.

As the vehicle 10 is moving toward an obstacle like the curb, a signal from the capacitive sensor system changes as the skid plate 18 moves toward the obstacle. The sensitivity of the capacitive sensor system is particularly high when the obstacle is, say, from 0 to 10 inches away. The sensitivity of the capacitive sensor system is especially high when the obstacle is from one to three inches away. Sensitivity at these relatively short distances can help to provide a reliable short-range alert to an operator of the vehicle, which can facilitate precise parking of the vehicle 10 near the obstacle.

Often, obstacles are encountered when positioning the vehicle 10 around a charging station. The capacitive sensor system may be particularly useful when positioning the vehicle 10 in advance of a charge.

Figure 5:
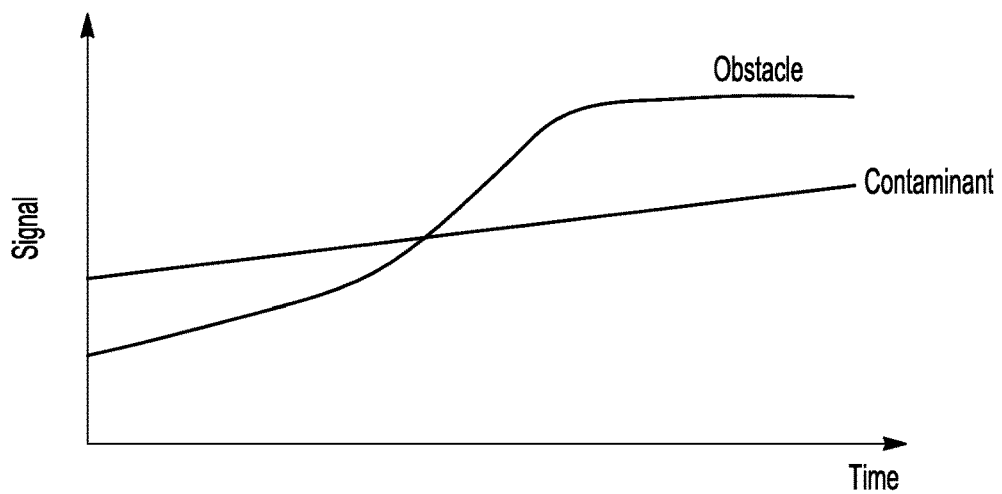
FIG. 5 graphically shows an output signal from the capacitive sensor system changing due to an accumulation of contaminants and the output signal changing due to an approaching obstacle.

With reference now to FIG. 5 and continued reference to FIG. 1, the capacitive sensor system can be used to detect proximity of the vehicle 10 to rocks and other protrusions that could potentially damage an underbody 22 of the vehicle 10. The vehicle 10 can be driven relatively slow when the capacitive sensor system is relied on to gather such information.

As the vehicle 10 is driven, the capacitive sensor system generates the output signal, which changes as a gap between the capacitive sensor system and a target (a rock, for example) changes. A build-up of contaminants, such as dirt, can also alter the output signal.

As shown in FIG. 5, changes in the output signal due to the buildup of dirt can be differentiated from an obstacle that could damage the underbody 22. Over time, dirt accumulation causes the output signal to gradually change. The output signal associated with an obstacle approaching has a sharper spike as shown.

Figure 6:
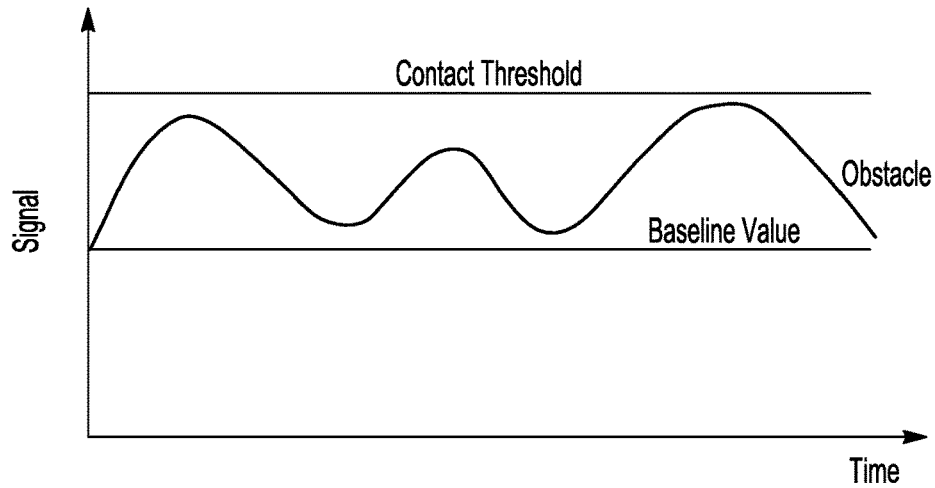
FIG. 6 graphically shows an output signal from a capacitive sensor system changing due to the vehicle bouncing up and down.

With reference now to FIG. 6, the skid plate 18 can move up and down with the vehicle 10 as the vehicle 10 is driven on bumpy terrain. The output signal from the capacitive sensor system can be monitored over time and compared to a contact threshold for the output signal. The contact threshold can be an output signal corresponding to the skid plate 18, or the underbody 22, being in contact, or very close to, the terrain beneath the vehicle 10.

If the output signal exceeds the contact threshold, an alert can be provided to an operator of the vehicle 10. The alert may prompt the operator to slow down the vehicle 10. The alert can be issued in response to the output signal exceeding the contact threshold and based on other information from other areas of the vehicle 10, such information from an accelerometer of the vehicle 10. The alerts of this disclosure could take many forms. The alerts could be visual alerts displayed in the vehicle 10 or audible alerts, for example.

Figure 7:
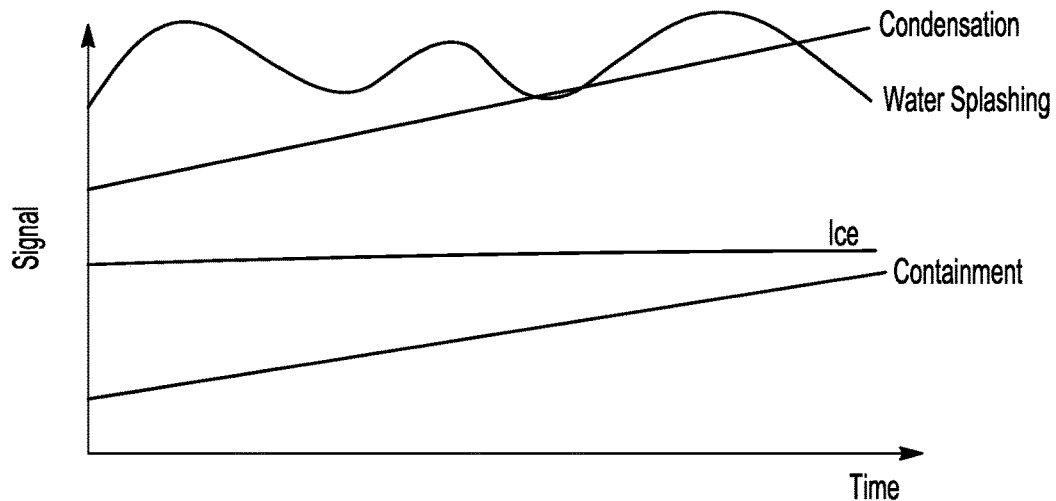
FIG. 7 graphically shows an output signal from the capacitive sensor system changing due to splashing water, due to condensation, due to ice, and due to an accumulation of contaminants.

With reference now to FIG. 7, as previously discussed, contaminants, such as dirt, accumulating on the skid plate 18 can, in some examples, cause the output signal to slowly change over time.

Liquid water splashing on the skid plate 18 can cause the output signal to periodically increase in intensity because of the dielectric associated with water.

Condensation due to humidity can cause the output signal to slowly rise over time and at a higher intensity than the slow rise resulting from contaminants.

Ice building up on the skid plate 18 can result in the output signal being fairly constant or exceedingly slow rising.

Information from the capacitive sensor system of the skid plate 18 relating to accumulating dirt, water splashing, condensation, or ice buildup can be used to assess the terrain that the vehicle 10 is traversing. The information can be used to, for example, provide road condition information to a user of the vehicle 10.

In some examples, a corrosiveness of contaminants accumulating on the skid plate 18 can be assessed by monitoring changes to the output signal from the capacitive sensor. If the corrosiveness exceeds a threshold, the system or other portion of the vehicle 10 may provide an alert recommending that the user should wash the vehicle 10.

As higher salinity contaminants build up on the skid plate 18, the output signal can increase due to an increasing dielectric constant. The build-up can become more corrosive as the salinity increases. If the salinity causes the output signal from the capacitive sensor system to exceed a certain value, the signal may prompt the vehicle 10 to display a message to the user indicating that the vehicle 10 recommends a wash due to accumulating contaminants.

Figure 8:
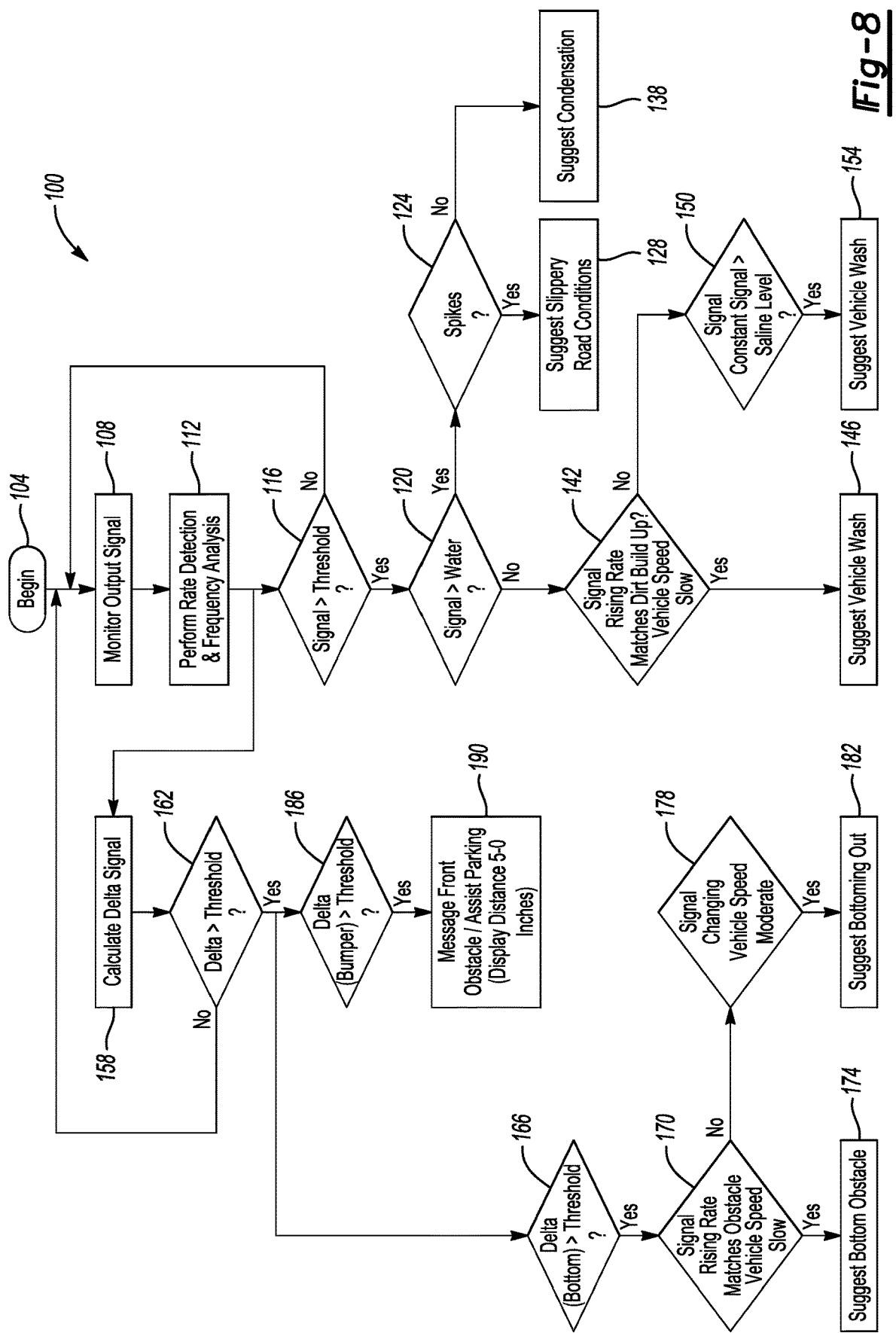
FIG. 8 illustrates a flow of an example method used in connection with the capacitive sensor system.

The flow of an example method 100 utilized in connection with the capacitive sensor system of FIGS. 1-4 is shown in FIG. 8. The method 100 begins at a step 104. Next, at a step 108, the method 100 monitors an output signal from the capacitive sensor system of the skid plate 18. Then, at a step 112, the method 100 performs rate detection of frequency analysis of the output signal obtained in the step 108.

If the output signal exceeds a threshold value at a step 116, the method 100 moves to a step 120, which assesses whether the output signal is greater than a threshold output signal amount associated with water. If yes, the method 100 moves to a step 124, which assesses whether or not the signal has various spikes. If yes, the method 100 moves to a step 128 where the method 100 communicates a message. The message could, for example, inform a driver of the vehicle that the road conditions are slippery. If there are no spikes indicating significant water at the step 124, the method 100 moves to the step 132, which can communicates a message that the detected water is associated with condensation. The messages of the method 100 can be viewed within a display of the vehicle or the messages could be audible. The messages can be conveyed to the user in other ways in other examples.

If, at the step 120, the output signal was not above a threshold signal value for water, the method 100 moves to the step 142, which assesses whether or not the output signal is rising at a rate that is associated with contaminant accumulation. At the step 142, the method 100 further assesses whether or not the vehicle's speed is slow. If yes, the method moves to the step 146, which can communicate a message suggesting that a user wash the vehicle.

If the signal, at the step 142, is not rising at a rate associated with a buildup of dirt, the method 100 moves from the step 142 to the step 150, which assesses whether or not the (relatively constant) output signal is greater than a threshold signal level associated with saline. If yes, the method 100 moves to a step 154, which communicates a message to a user indicating that the saline levels may lead to vehicle corrosion.

Referring again to the step 112, which performed the rate detection and frequency analysis of the acquired signals, the method 100 can additionally move to a step 158, which calculates a change in the output signal. If the change in the output signal is greater than a threshold at a step 162, the method 100 moves to a step 166 or a step 170 depending on whether the capacitive field is emanating vertically downward from the skid plate or forward from the skid plate.

If the field is emanating primarily vertically downward, the method 100 moves to a step 166 assesses whether the change in the output signal is greater than a threshold value. If yes, the method 100 moves to the step 170, which assesses whether the change in the output signal is rising at a rate that matches an obstacle and a speed of the vehicle is slow. If yes, the method 100 moves to step 174, which communicates a message to a user indicating that the skid plate of the vehicle is near an obstacle.

If, at the step 170, the change in the output signal is not rising at a rate that matches an obstacle, the method moves to the step 178, which assesses whether or not the signal is changing while the vehicle speed is moderate. If yes, the method 100 can move to a step 182, which can provide a message indicating that the vehicle is nearing a bottoming out situation.

If the capacitive field is emanating primarily vertically forward, the method 100 moves from the step 162 to a step 186, which assesses whether the change in the output signal is greater than a another threshold value. If yes, the method 100 moves to the step 190, which communicates a message to a user indicating that an obstacle is in front of the bumper assembly. The message can, in some examples, display the proximate distance between the bumper assembly and the obstacle.

Although a specific component relationship is illustrated in the figures of this disclosure, the illustrations are not intended to limit this disclosure. In other words, the placement and orientation of the various components shown could vary within the scope of this disclosure. In addition, the various figures accompanying this disclosure are not necessarily to scale, and some features may be exaggerated or minimized to show certain details of a particular component.

The preceding description is exemplary rather than limiting in nature. Variations and modifications to the disclosed examples may become apparent to those skilled in the art that do not necessarily depart from the essence of this disclosure. Thus, the scope of legal protection given to this disclosure can only be determined by studying the following claims.

What is claimed is:

1. A vehicle assembly, comprising:
   a bumper assembly;
   a skid plate; and
   a capacitive sensor system of the skid plate, wherein the skid plate is electrically isolated from the bumper assembly.

2. The vehicle assembly of claim 1, wherein the capacitive sensor system is from 10 to 25 percent by weight graphene.

3. The vehicle assembly of claim 1, wherein the capacitive sensor system includes a conductive coating adjacent a base substrate.

4. The vehicle assembly of claim 1, wherein the skid plate faces vertically downward.

5. A vehicle assembly, comprising:
a bumper assembly;
a skid plate; and
a capacitive sensor system of the skid plate, wherein the capacitive sensor system comprises a graphene infused material.

6. The vehicle assembly of claim 5, further comprising a skin covering the graphene infused material.

7. The vehicle assembly of claim 6, wherein the skin is molded-in-color and is non-conductive.

8. A vehicle assembly, comprising:
a bumper assembly;
a skid plate; and
a capacitive sensor system of the skid plate, wherein the capacitive sensor system is sealed within the skid plate.

9. The vehicle assembly of claim 8, wherein an active ground extends about a periphery of the capacitive sensor.

10. The vehicle assembly of claim 9, wherein the active ground is sealed within the skid plate.

11. A sensing method for a vehicle, comprising:
using a capacitive sensing system to detect a proximity of a vehicle to an object, the capacitive sensing system incorporated into a skid plate that is vertically beneath a portion of a bumper assembly of the vehicle, wherein the skid plate is electrically isolated from the bumper assembly.

12. The sensing method of claim 11, wherein the capacitive sensor system comprises a graphene infused material.

13. The sensing method of claim 11, wherein the capacitive sensor system is sealed within the skid plate.

14. The sensing method of claim 11, wherein the skid plate faces vertically downward.

15. The sensing method of claim 11, further comprising evaluating a rate of change in an output signal from the capacitive sensing system to detect whether the object is moving relatively closer to the skid plate or whether contaminants are accumulating on the capacitive sensing system.

16. The sensing method of claim 15, further comprising recommending that the vehicle is washed based on an output signal from the capacitive sensing system.

17. The sensing method of claim 11, further comprising comparing an output signal from the capacitive sensing system to a threshold value to assess a distance between the vehicle and terrain beneath the vehicle.

18. The sensing method of claim 11, further comprising evaluating a rate of change in an output signal from the capacitive sensing system to assess a road condition.

* * * * *